United States Patent
Igel-Holtzendorff et al.

(10) Patent No.: US 10,056,459 B2
(45) Date of Patent: Aug. 21, 2018

(54) SEMICONDUCTOR ARRANGEMENT

(71) Applicant: Nexperia B.V., Nijmegen (NL)

(72) Inventors: Thomas Igel-Holtzendorff, Hamburg (DE); Reza Behtash, Hamburg (DE); Tim Boettcher, Hamburg (DE)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 14/879,394

(22) Filed: Oct. 9, 2015

(65) Prior Publication Data
US 2016/0172451 A1    Jun. 16, 2016

(30) Foreign Application Priority Data
Dec. 10, 2014  (EP) ..................... 14197250

(51) Int. Cl.
| | |
|---|---|
| *H01L 21/00* | (2006.01) |
| *H01L 29/40* | (2006.01) |
| *H01L 21/28* | (2006.01) |
| *H01L 29/423* | (2006.01) |
| *H01L 21/02* | (2006.01) |
| *H01L 21/3105* | (2006.01) |
| *H01L 21/321* | (2006.01) |
| *H01L 29/78* | (2006.01) |
| *H01L 29/861* | (2006.01) |

(52) U.S. Cl.
CPC ...... *H01L 29/407* (2013.01); *H01L 21/02255* (2013.01); *H01L 21/02271* (2013.01); *H01L 21/28017* (2013.01); *H01L 21/31051* (2013.01); *H01L 21/32115* (2013.01); *H01L 29/401* (2013.01); *H01L 29/4236* (2013.01); *H01L 29/7813* (2013.01); *H01L 29/861* (2013.01)

(58) Field of Classification Search
CPC ............. H01L 29/407; H01L 21/02271; H01L 21/02255
See application file for complete search history.

(56) References Cited

U.S. PATENT DOCUMENTS

| | | | |
|---|---|---|---|
| 5,365,102 A | 11/1994 | Mehrotra et al. | |
| 5,612,567 A | 3/1997 | Baliga | |
| 7,525,133 B2 * | 4/2009 | Ohta ................... | H01L 29/0649 257/213 |
| 2006/0289931 A1 | 12/2006 | Kim et al. | |

(Continued)

FOREIGN PATENT DOCUMENTS

| | | | | |
|---|---|---|---|---|
| EP | 3032586 A1 * | 6/2016 | ....... | H01L 21/28017 |
| JP | 2000243952 | * 8/2000 | ............. | H01L 29/78 |

(Continued)

OTHER PUBLICATIONS

Extended European Search Report for EP Patent Appln. No. 14197250.5 (dated May 27, 2015).

*Primary Examiner* — Laura Menz
(74) *Attorney, Agent, or Firm* — Ohlandt, Greeley, Ruggiero & Perle, L.L.P.

(57) ABSTRACT

A semiconductor arrangement comprising a substrate having a first trench formed therein, a field plate layer arranged to extend within the first trench and coat the first trench, the field plate layer having a thickness such that it defines a second trench within the first trench, a barrier layer arranged to coat an internal surface of the second trench; and a trench fill material configured to substantially planarize the first and second trenches.

9 Claims, 5 Drawing Sheets

(56) References Cited

U.S. PATENT DOCUMENTS

| | | | | |
|---|---|---|---|---|
| 2007/0145416 A1* | 6/2007 | Ohta | ............... | H01L 29/0649 |
| | | | | 257/213 |
| 2012/0241854 A1* | 9/2012 | Ohta | ............... | H01L 29/0856 |
| | | | | 257/331 |
| 2016/0172451 A1* | 6/2016 | Igel-Holtzendorff | ............... | |
| | | | | H01L 21/28017 |
| | | | | 257/488 |

FOREIGN PATENT DOCUMENTS

| | | |
|---|---|---|
| JP | 2000-243952 | 9/2000 |
| WO | 97/43789 | 11/1997 |

\* cited by examiner

SEMICONDUCTOR ARRANGEMENT

CROSS-REFERENCE TO RELATED APPLICATIONS

This application claims the priority under 35 U.S.C. § 119 of European patent application no. 14197250.5, filed on Dec. 10, 2014, the contents of which are incorporated by reference herein.

FIELD OF THE INVENTION

This disclosure relates to a semiconductor arrangement and, in particular, it relates to a semiconductor arrangement comprising a trench and a method for fabricating such an arrangement.

BACKGROUND OF THE INVENTION

Semiconductor components or parts thereof may be formed using a trench-MOS process. A trench, typically comprising a substantially vertical channel deeper than it is wide, may be formed in a substrate. Deposition of material inside the trench may be performed by chemical vapour deposition (CVD). In practice, it has been found that voids can form in the material deposited into the trench.

BRIEF SUMMARY OF THE INVENTION

According to a first aspect we provide a semiconductor arrangement comprising a substrate having a first trench formed therein, a field plate layer arranged to extend within the first trench, the field plate layer having a thickness such that it defines a second trench within the first trench, a trench fill material configured to substantially planarize the first and second trenches wherein the arrangement includes a barrier layer arranged to coat an internal surface of the second trench between the field plate layer and the trench fill material.

This is advantageous as it has been found that the barrier layer may act as a diffusion barrier to reduce the chance of voids formed in the trench fill material migrating to the field plate layer where they may interfere with the operation of the field plate layer when the arrangement is in use. This arrangement is particularly advantageous if the semiconductor arrangement is subject to subsequent high temperature processing, such as annealing, as the migration of voids towards walls of the trench has been found to occur at higher temperatures, such as described below.

The semiconductor arrangement may include a further layer in the first trench between the substrate and the field plate layer, such as an oxide layer, a nitride layer, diffusion barrier layer, and/or an electrically insulating layer. The substrate may be of silicon.

The thickness of the field plate layer from any internal surface of the first trench may be less than half of the width of the first trench. This is advantageous as it may reduce the risk of forming voids in the field plate layer. The field plate layer may have a substantially uniform thickness.

The field plate layer may be of the same material as the trench fill material. Thus, the barrier layer may be configured to provide a separating surface between the part of the material configured to provide an electric field (the field plate layer) and the part of the material configured to fill the trench.

The barrier layer may be electrically insulating relative to the field plate layer. The barrier layer may comprise a deposited or a thermally grown oxide (such as in addition to a native oxide). Forming the barrier layer using an oxide may be advantageous as an annealing step may be used to oxidise the walls of the trench and/or walls of the field plate layer. The barrier layer may comprise a nitride. The barrier layer may serve to electrically isolate the field plate layer from the trench fill material. Other than an oxide and a nitride, the barrier layer may comprise any other material that acts as a diffusion barrier. It has also been found that the barrier layer may act to halt the migration of voids in the trench fill material thereby protecting the field plate layer from receiving void(s) that migrate from the trench fill material, such as during subsequent high temperature processing steps. The barrier layer may comprise a laminate of several layers, one or more or all of which may act as a diffusion barrier.

The further layer may comprise a further barrier layer configured to coat the internal surface of the first trench between the substrate and the field plate layer. When the further barrier layer is present, the field plate layer may be arranged to extend within the first trench and coat the further barrier layer. The combined thickness of the further barrier layer and the field plate layer on any surface may be less than half of the width of the first trench. This is advantageous as the further barrier layer may electrically insulate the field plate layer from the substrate. The barrier layer and the further barrier layer may be of the same material. The barrier layer and the further barrier layer may be of different material.

The field plate layer may be polycrystalline silicon. The trench fill material may comprise polycrystalline silicon. The combination of a polycrystalline silicon field plate layer with an oxide barrier layer separating it from a trench fill material has been found to be advantageous.

The field plate layer may be doped to at least $1 \times 10^{17}$ cm$^{-3}$. This is advantageous and provides for an efficient trench based field plate. The dopant may comprise POCl3, although other dopants such as dopants to increase the electric conductivity of the semiconducting material of the field plate, may be used.

According to a second aspect we provide a method for fabricating a semiconductor arrangement comprising receiving a substrate having a first trench formed therein; forming a field plate layer such that it extends within the first trench, the field plate layer having a thickness such that it defines a second trench within the first trench; forming a barrier layer arranged to coat an internal surface of the second trench; planarizing the substrate with a trench fill material for forming a substantially planar surface over the first and second trenches.

The provision of a barrier layer is advantageous as it may act as a diffusion barrier to the migration of voids formed in the trench fill material in a direction towards the field plate layer. The barrier layer may provide for a field plate layer having a high integrity and may therefore generate a uniform electric field in the substrate in use.

In some examples, the method may include a further step of forming a further barrier layer arranged to coat an internal surface of the first trench. The field plate layer may thus be formed such that it extends within the first trench and coats the further barrier layer.

The step of forming the barrier layer may comprise annealing. Alternatively, the step of forming the barrier layer may comprise applying said layer by chemical vapour deposition.

The step of forming the field plate layer may be performed such that the thickness at any point perpendicular to the internal surface of the first trench is less than half of the width of the first trench. This is advantageous as it may reduce the risk of forming voids in the field plate layer.

If the further barrier layer is present then the step of forming the further barrier layer and forming the field plate layer may be performed such that the average thickness perpendicular to the internal surface (and in particular the side walls) of the first trench is less than half of the width (or less than 40%, 30% or 25% of the width) of the first trench. This is advantageous as it may reduce the risk of forming voids in the field plate layer.

The method described above may include, following the step of planarizing, a fabrication step performed at above 600° C. This may cause any voids formed in the trench fill material to migrate towards the field plate layer. However the barrier layer may provide an effective barrier to prevent the voids interfering with the integrity of the field plate layer.

According to a third aspect we provide a semiconductor component including the semiconductor arrangement of the first aspect. The semiconductor component may comprise a diode or a transistor (such as a MOS transistor) or a power transistor or other component. According to a further aspect we provide an electronic device including the semiconductor component of the third aspect.

The electronic device may comprise an amplifier, a base station for a mobile telecommunication network or a satellite receiver or other device. There now follows, by way of example only, a detailed description of embodiments with reference to the following figures, in which:

DETAILED DESCRIPTION OF THE INVENTION

Figure 1:
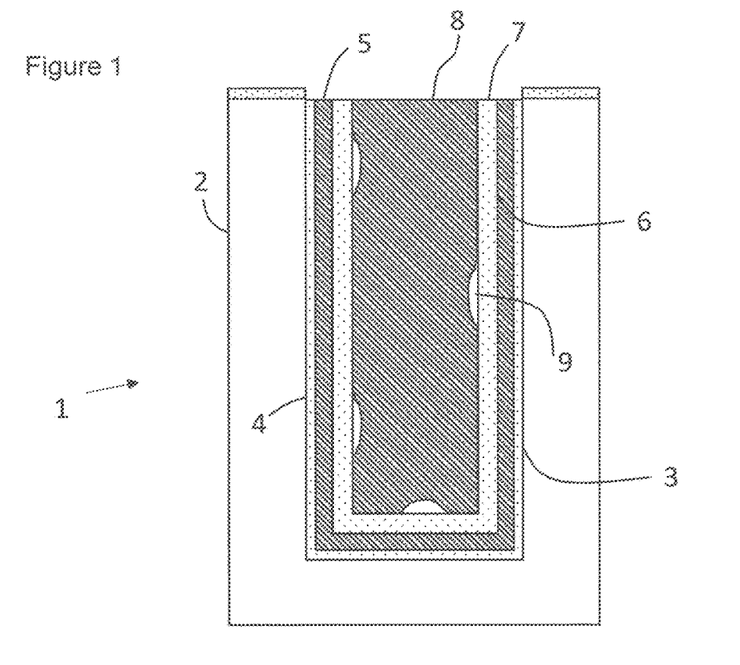
FIG. 1 shows a schematic view of an example semiconductor arrangement.

FIG. 1 shows a semiconductor arrangement 1. More specifically, FIG. 1 shows a semiconductor arrangement 1 comprising a substrate 2 having a first trench 3 formed therein. A further barrier layer 4 is arranged to coat, i.e. form a layer on rather than fill the trench, an internal surface of the first trench 3. In other embodiments the further barrier layer 4 may not be present. A field plate layer 5 is arranged to extend within the first trench 3 and coat the further barrier layer 4. The field plate layer 5 has a thickness such that it defines a second trench 6 within the first trench 3. A barrier layer 7 is arranged to coat an internal surface of the second trench 6. A trench fill material 8 is configured to substantially fill and planarize the first and second trenches 3, 6 and thus may be etched (such as dry etch) to form a planar surface over the first and second trenches relative to the substrate. Thus, while the first trench may be etched into the substrate 2, the second trench is formed within the first trench 3 following the application of the layers 4 and 5 onto the walls of the first trench.

In a first example the substrate 2 may be formed of silicon however it can be appreciated that any suitable semiconductor material can be used, such as gallium nitride or gallium arsenide.

Forming a trench in the semiconductor substrate is advantageous as it allows area to be saved on the surface of the semiconductor substrate and can result in higher current handling capabilities of a resulting component. Components that include trench arrangements include, for example, a trench MOSFET or a trench diode. In this example, the trench comprises a recess or channel in the substrate which can be filled with appropriate material(s) to form at least part of a semiconductor component. The trench 3 comprises a recess or channel having a depth that is greater than its width. No restriction is placed on the length of a trench in the semiconductor arrangement beyond the length of the semiconductor substrate 2 itself.

The further barrier layer 4 may serve to electrically insulate the trench device from the substrate 2. The further barrier layer 4 may comprise any material which is electrically insulating, which may be relative to the field plate layer 5. In a first embodiment the further barrier layer 4 is formed of an oxide. The provision of an oxide is advantageous, such as silicon dioxide where the substrate is of silicon, as the surface of the substrate within the first trench can be oxidized rather than the layer being formed by deposition. The oxide thickness may be increased by a successive deposited oxide in order to achieve sufficient voltage stability. In a second embodiment the further barrier layer 4 is formed of a nitride or deposited nitride such as silicon nitride.

The field plate layer may be configured to provide, when in use, a conductive layer in the trench for shaping the electric field in the substrate under applied bias voltage. The field plate layer 5 in this example comprises a semiconductor material and is electrically conductive. The field plate layer 5 may comprise polycrystalline silicon. The semiconductor material of the field plate layer 5 may have a doping level of at least $1 \times 10^{17}$ cm$^{-3}$. Optimum operational performance of the device is reliant upon sufficient doping levels of the semiconductor device. In a first embodiment the dopant is phosphorous; applied by POCl3 diffusion or an ion implantation process, for example. In a second embodiment the dopant is boron. In a further embodiment the dopant is any other suitable dopant for the semiconductor material being used.

The field plate layer 5 is arranged to extend within the first trench 3 and coat the further barrier layer 4 such that the field plate layer 5 has a thickness that defines a second trench 6 within the first trench. The second trench 6 allows for further layers to be formed therein which may reduce the risk of voids, formed when the trench is filled, from migrating and interfering with the field plate layer. In particular, constructing the arrangement such that the average combined thickness of the further barrier layer 4 and the field plate layer 5 on the side walls is less than half of the width of the first trench 3 allows for the provision of a barrier layer before the trench is filled. By providing the conductive field plate material as a layer rather than filling the trench, the opportunity for growth surfaces from opposing sides of the first trench to meet and form voids 9 is reduced.

The barrier layer 7 is arranged to coat an internal surface of the second trench 6. This is advantageous as the barrier layer 7 has been found to act as a barrier to the migration of voids 9 to the interface between the field plate layer 5 and either the substrate 2 or the further barrier layer 4, which will be described in more detail in relation to FIGS. 3 and 4. Hence any voids 9 formed within the trench fill material 8 configured to substantially planarize the first and second trenches 3, 6 may not impact upon the performance of the semiconductor arrangement 1.

The barrier layer 7 may comprise a non-conductive layer. The barrier layer may comprise an oxide layer, such as a thermally grown or a deposited oxide layer, a nitride layer, such as a deposited nitride layer or any material which may hinder the migration of voids 9 formed in the trench fill material from entering the field plate layer 5. A native oxide layer may form during processing which may be added to by the barrier layer. The barrier layer 7 may comprise the same material as the further barrier layer 4. The barrier layer 7 may comprise a different material to the further barrier layer 4.

Figure 8:
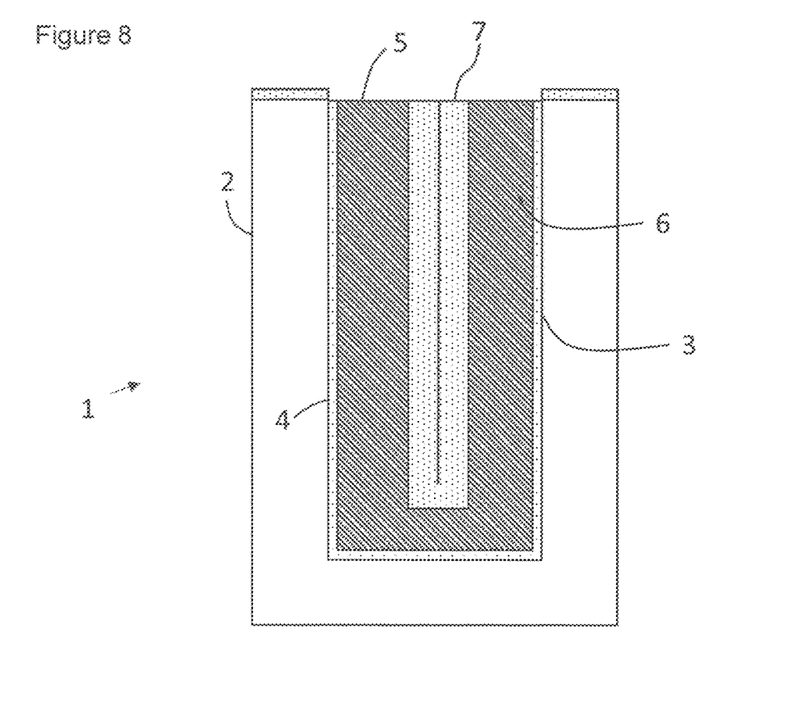
FIG. 8 shows a schematic view of the semiconductor arrangement wherein the trench fill material is the same as the barrier layer material.

The trench fill material 8 is configured to extend into the volume defined by the first trench 3 (limited by the presence of the layers described above) to planarize the trench 3 with respect to the surface of the substrate 2 in which the trench is formed. The trench fill material 8 may be of the same material as the field plate layer 5, such as polycrystalline silicon. Alternatively, the trench fill material 8 may be of the same material as the barrier layer 7. Thus, the application of the barrier layer 7 may continue such that the second trench is filled with the barrier layer material, which may comprise an oxide or nitride and as shown in FIG. 8.

Each of the layers described above, namely the further barrier layer 4, the field plate layer 5, and the barrier layer 7, may each be of a substantially uniform thickness, particularly in the region of the side walls of the trench distal a base of the trench. The layers themselves may have the same or different average thicknesses in comparison to one another. In the example above, the layers are shown as substantially completely covering the internal walls (side walls, end walls and a base wall) of the trenches 3, 6. However, it will be appreciated that in other examples, the layers may extend over at least 50%, 60%, 70%, 80% or 90% of the internal walls of the trench.

Figure 2:
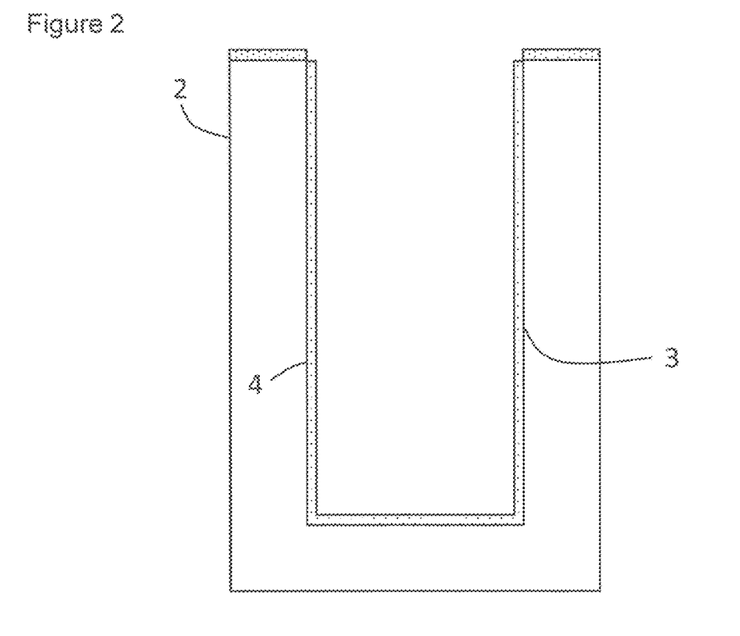
FIG. 2 shows a schematic view of a trench coated with a further barrier layer therein.
Figure 3:
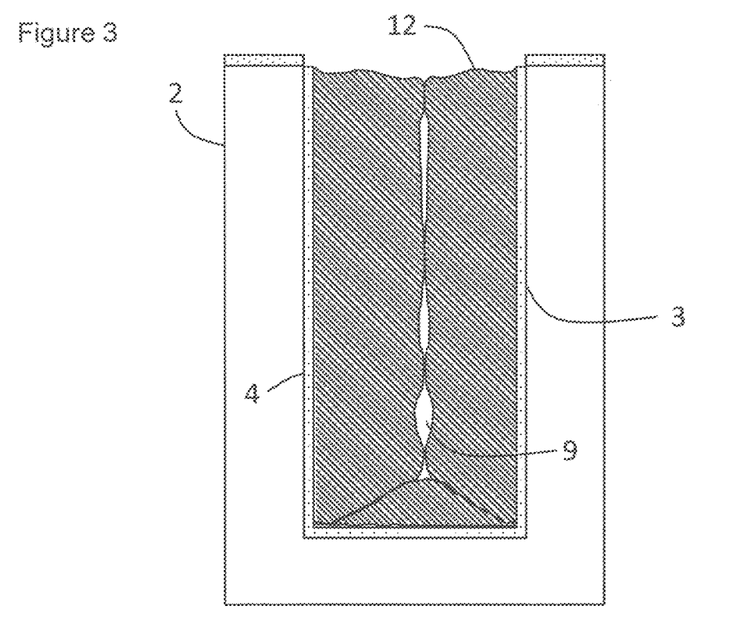
FIG. 3 shows a schematic view of the trench of FIG. 2 wherein the remainder of the trench is filled with a trench fill material.
Figure 4:
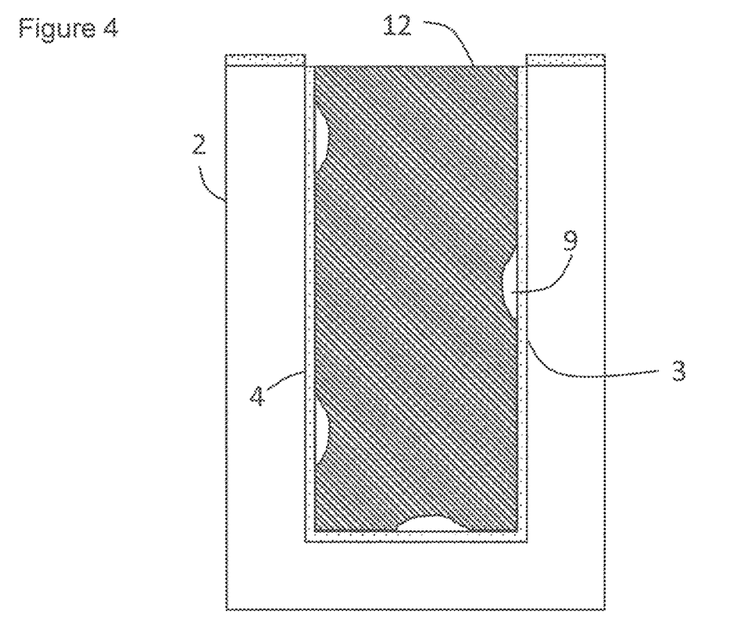
FIG. 4 shows a schematic view of the filled trench of FIG. 3 following an annealing step.

FIGS. 2, 3 and 4 illustrate an example in which the barrier layer 7 is not provided between a conductive layer (i.e. the field plate layer) and a trench fill material and how voids formed in the trench fill material may migrate. The same reference numerals have been used for corresponding parts. FIG. 2 shows a trench 3 and an oxide layer 4. In this example, the field plate 12 is configured to fill the trench rather than form a layer on the walls of the trench. Thus, in this example, the field plate 12 is also equivalent to the trench fill material of the previous example. Forming the field plate 12 in this way can result in the formation of voids 9 within the first trench 3 as shown in FIG. 3. Upon annealing above 600° C. the voids 9 may become mobile within the first trench 3. Mobile voids 9 are then free to migrate to the interface between the oxide layer 4 and the field plate 12 causing imperfections in the field plate 12 as shown in FIG. 4. Imperfections in the field plate 12 reduce the device performance and may ultimately result in failure of the device.

Returning to the first semiconductor arrangement 1, shown in FIG. 1, FIGS. 2 to 7 illustrate the formation of said arrangement 1.

FIG. 2 shows the substrate 2 having the first trench 3 etched therein and the internal surfaces or walls of the first trench 3 are coated with an oxide. The area around the trench on the surface of the substrate in which the trench is formed may also include an oxide layer.

Figure 5:
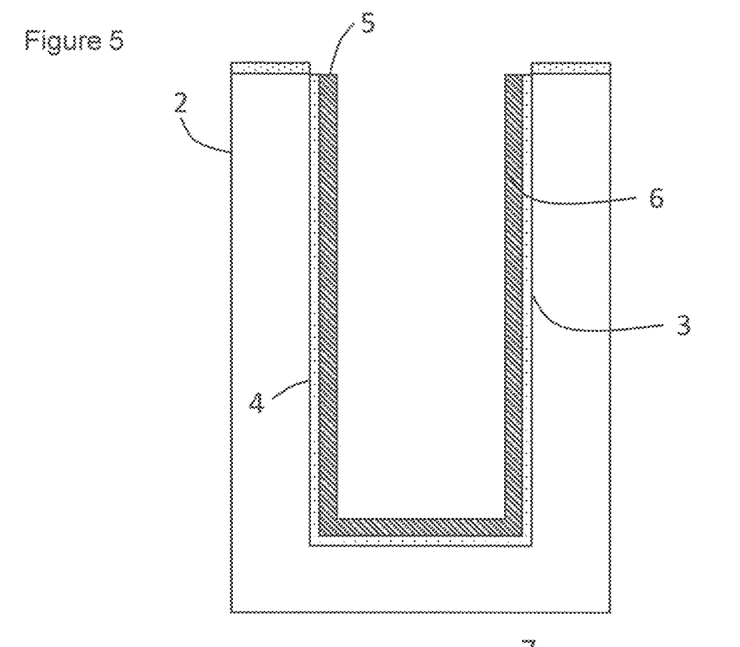
FIG. 5 shows a schematic view of the trench of FIG. 2 wherein a field plate layer has been formed upon the further barrier layer and has formed a second trench.

FIG. 5 illustrates the formation of the field plate layer 5 on the further barrier layer 4. In this embodiment the combined thickness of the further barrier layer 4 and the field plate layer 5 at any point perpendicular to the surface of the first trench 3 is substantially less than half of the width of the first trench 3. It can be appreciated that the combined thickness of the further barrier layer 4 and the field plate layer 5 at any point perpendicular to the surface of the first trench 3 can be any thickness below half of the total thickness of the first trench 3 in order to still form a second trench 6 without the growth of the field plate layer from opposed walls meeting and potentially forming voids 9.

Figure 6:
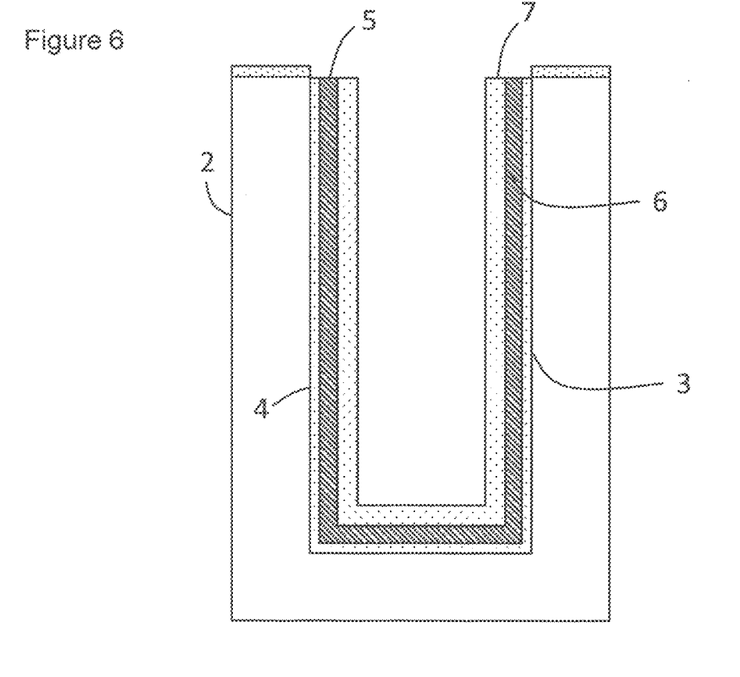
FIG. 6 shows a schematic view of a barrier layer formed upon the field plate layer.

FIG. 6 shows the formation of a barrier layer 7 on the field plate layer 5. Following the formation of the barrier layer 7, a trench remains to be filled by trench fill material.

Figure 7:
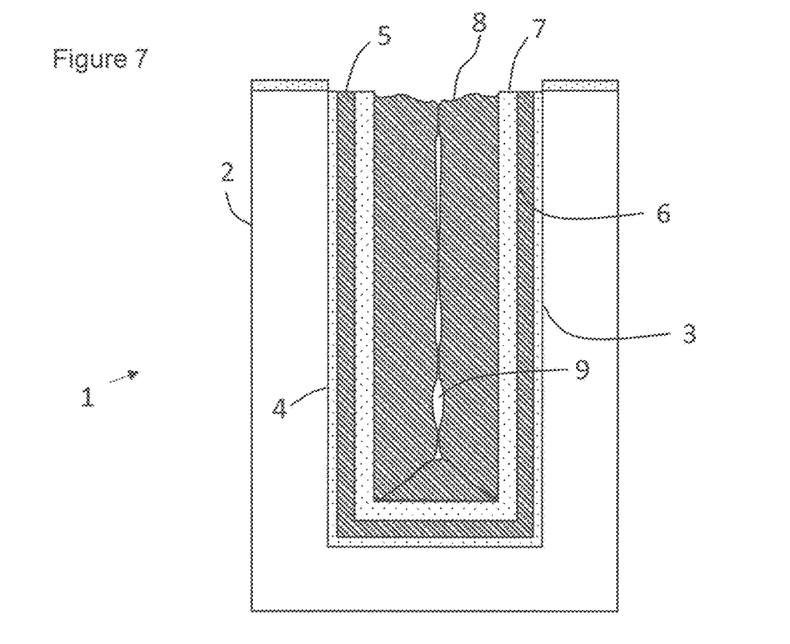
FIG. 7 shows a schematic view of the semiconductor arrangement wherein the remainder of the second trench is filled with a trench fill material.

FIG. 7 shows how the semiconductor arrangement can then be planarized by the trench fill material to form the semiconductor arrangement 1. It has been found that in the event of voids 9 forming within the remaining volume of the second trench 6 when the trench is filled, upon annealing these migrate to the interface of the barrier layer 7 and the fill material 8, as shown in FIG. 1.

FIG. 8 shows an embodiment of the semiconductor arrangement wherein the trench fill material 8 is the same as the barrier layer material 7.

Figure 9:
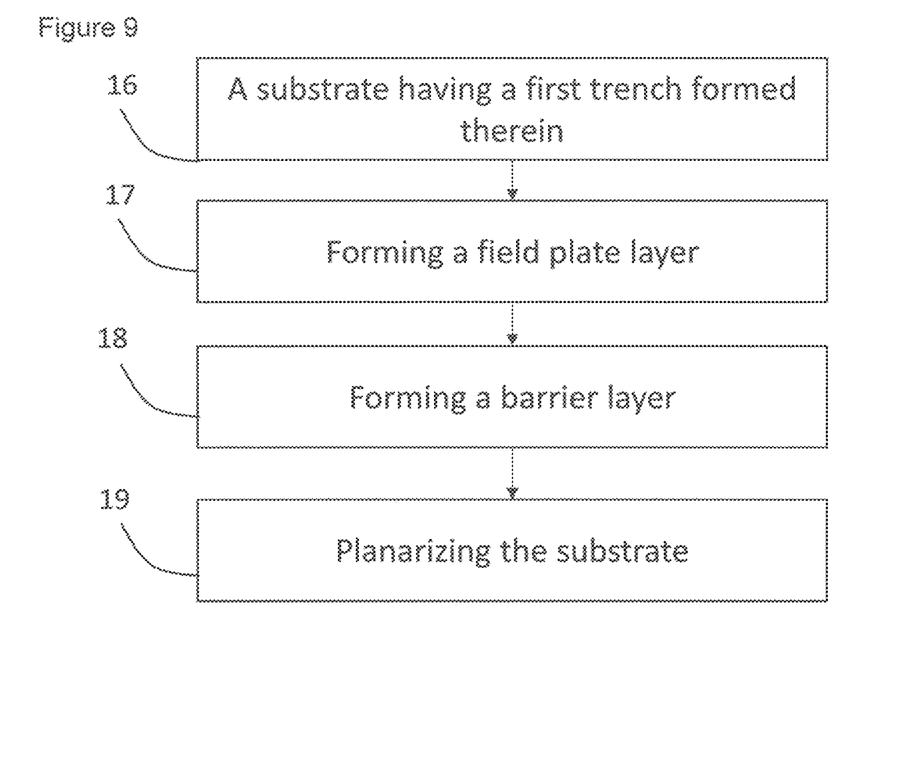
FIG. 9 shows a flow chart illustrating a method of fabricating a semiconductor arrangement.

FIG. 9 shows a flow chart illustrating the method for fabricating a semiconductor arrangement 1 as shown in FIGS. 2, 5, 6, and 7. The method 15 comprises receiving a substrate having a trench formed therein 16; forming a field plate layer 17 such that it extends within the first trench, the field plate layer having a thickness such that it defines a second trench within the first trench; forming a barrier 18 layer arranged to coat an internal surface of the second trench, planarizing the substrate 19 with a trench fill material for forming a substantially planar surface over the first and second trenches.

The method may include the step of forming a further barrier layer arranged to coat an internal surface of the first trench before the step of forming a field plate layer 17.

The barrier layer 7 may be formed in a number of ways. In a first embodiment the barrier layer 7 may be formed by annealing, thus forming a thermally grown oxide. In a second embodiment the barrier layer 7 may be formed by chemical vapour deposition (CVD) of nitride or oxide.

The field plate layer 5 may be formed by chemical vapour deposition (CVD). The trench fill material may be applied by chemical vapour deposition (CVD).

The method described in FIG. 9 may be followed by a step in which the arrangement 1 is annealed at above 600° C. This annealing stage results in the migration of the voids 9 through the trench fill material 8. It can be appreciated by the skilled person that annealing at lower temperatures for longer periods of time can result in the same degree of movement of the voids 9. Equally, it can be appreciated that annealing at temperatures higher than 600° C. can result in more rapid migration of the voids 9. The method of forming the barrier layer 7 is particularly advantageous if the arrangement 1 is subject to such subsequent high temperature processing steps.

Figure 10:
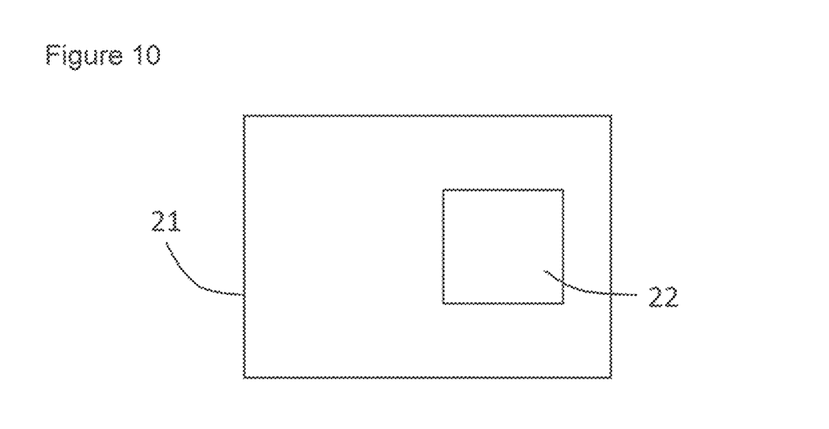
FIG. 10 shows a schematic view of an electronic device including a semiconductor component having the arrangement of FIG. 1 or 7.

It can be appreciated that a semiconductor arrangement 1 such as that described herein can be used to form a semiconductor component, for example a trench diode or trench MOSFET. It can also be appreciated that the use of such a semiconductor component may improve the performance and reliability of a range of electronic devices. Such devices may include, but not be limited to: a flyback convertor, a navigation system, a transmitter/receiver arrangement for a telecommunications device, or a range of components in a computing device. FIG. 10 shows an electronic device 21 including a semiconductor component 22, which may be formed using the semiconductor arrangement described herein.

The invention claimed is:

1. A semiconductor arrangement comprising:
a substrate having a first trench formed therein;
a field plate layer arranged to extend along a base and a plurality of side walls within the first trench, the field plate layer having a thickness on the side walls so that the field plate layer defines a second trench within the side walls of the first trench; and
a trench fill material configured to substantially planarize the first and second trenches wherein the arrangement includes a barrier layer arranged to coat an internal surface of the second trench between the field plate layer and the trench fill material,
wherein the semiconductor arrangement includes a further barrier layer in the first trench between the substrate and the field plate layer, wherein the further barrier layer comprises the same material as the barrier layer.

2. The semiconductor arrangement of claim 1, wherein the field plate layer is of the same material as the trench fill material.

3. The semiconductor arrangement of claim 1, wherein the barrier layer is electrically insulating relative to the field plate layer.

4. The semiconductor arrangement of claim 1, wherein the barrier layer comprises an oxide.

5. The semiconductor arrangement of claim 1, wherein the barrier layer comprises a nitride.

6. The semiconductor arrangement of claim 1, wherein the field plate layer comprises polycrystalline silicon and/or the trench fill material comprises polycrystalline silicon.

7. The semiconductor arrangement of claim 1, wherein the field plate layer is doped to at least $1\times10^{17}$ cm$^{-3}$.

8. A semiconductor component including a semiconductor arrangement comprising:
a substrate having a first trench formed therein;
a field plate layer arranged to extend along a base and a plurality of side walls within the first trench, the field plate layer having a thickness on the side walls so that the field plate layer defines a second trench within the first trench, wherein the second trench extends in parallel along the base and the side walls of the first trench, and includes an area within the field plate layer between the side walls; and
a trench fill material arranged to fill the area within the field plate layer between the side walls and substantially planarize the first and second trenches, wherein the arrangement includes a barrier layer to coat an internal surface of the second trench between the field plate layer and the trench fill material,
wherein the semiconductor arrangement includes a further barrier layer in the first trench between the substrate and the field plate layer, wherein the further barrier layer comprises the same material as the barrier layer.

9. An electronic device comprising a semiconductor component, the semiconductor component comprising:
a substrate having a first trench formed therein;
a field plate layer arranged to extend along a base and a plurality of side walls within the first trench, the field plate layer having a thickness on the side walls so that the field plate layer defines a second trench within the side walls of the first trench; and
a trench fill material arranged to substantially planarize the first and second trenches, wherein the arrangement includes a barrier layer to coat an internal surface of the second trench between the field plate layer and the trench fill material,
wherein the semiconductor component includes a further barrier layer in the first trench between the substrate and the field plate layer, wherein the further barrier layer comprises the same material as the barrier layer.

* * * * *